United States Patent
Oohashi et al.

(10) Patent No.: US 8,784,715 B2
(45) Date of Patent: Jul. 22, 2014

(54) STRUCTURE OF PARTS MADE FROM PLURAL COMPOSITE PIECES AND METHOD OF BUILDING THOSE PARTS

(75) Inventors: Katsuhide Oohashi, Mito (JP); Shigeo Amagi, Tokai (JP); Osamu Miyo, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 718 days.

(21) Appl. No.: 12/616,826

(22) Filed: Nov. 12, 2009

(65) Prior Publication Data

US 2010/0052213 A1    Mar. 4, 2010

Related U.S. Application Data

(62) Division of application No. 11/167,791, filed on Jun. 28, 2005, now abandoned.

(30) Foreign Application Priority Data

Jul. 2, 2004 (JP) .................................. 2004-196197

(51) Int. Cl.
B29C 45/14    (2006.01)

(52) U.S. Cl.
USPC ........................................................ 264/279

(58) Field of Classification Search
USPC ........................................................ 264/279
See application file for complete search history.

(56) References Cited

U.S. PATENT DOCUMENTS

| | | |
|---|---|---|
| 4,480,975 A | 11/1984 | Plummer et al. |
| 5,462,457 A | 10/1995 | Schroepfer et al. |
| 5,600,885 A | 2/1997 | Schroepfer et al. |
| 5,714,106 A | 2/1998 | Yoda et al. |
| 6,187,242 B1 | 2/2001 | Onoda |
| 6,780,067 B1 | 8/2004 | Kono et al. |
| 6,893,590 B1 | 5/2005 | Rigosi et al. |
| 7,255,610 B2 | 8/2007 | Oohashi et al. |
| 2002/0045496 A1 | 4/2002 | Dewanjee et al. |
| 2002/0058122 A1 | 5/2002 | Arai et al. |

FOREIGN PATENT DOCUMENTS

| | | |
|---|---|---|
| EP | 1170110 | 1/2002 |
| EP | 1 621 314 B1 | 10/2011 |
| FR | 1376117 | 10/1964 |
| GB | 2112316 A | 7/1983 |
| JP | 07142817 | 6/1995 |
| JP | 11-140330 A | 5/1999 |
| JP | 2000326359 A | 11/2000 |

*Primary Examiner* — Larry Thrower
(74) *Attorney, Agent, or Firm* — Crowell & Moring LLP

(57) ABSTRACT

A pre-molded part is formed by pre-molding an insert with a pre-molded member, and then the pre-molded part is inserted into an over-molded member composed of thermo plastic resin. After applying a heat treatment with a temperature lower than a crystalline melting point of the pre-molded part to the pre-molded part surrounding the insert, a firm contact between the insert and the resin surrounding the insert without a gap at the interface between those parts is obtained.

10 Claims, 14 Drawing Sheets

A-A

D-D

G-G

H-H

I-I

L-L

K-K

L-L

L-L

STRUCTURE OF PARTS MADE FROM PLURAL COMPOSITE PIECES AND METHOD OF BUILDING THOSE PARTS

CROSS REFERENCE TO RELATED APPLICATION

This application is a divisional application of U.S. application Ser. No. 11/167,791, filed Jun. 28, 2005 now abandoned, which claims priority under 35 U.S.C. §119 to Japanese Patent Application No. 2004-196197, filed Jul. 2, 2004, the entire disclosure of which is herein expressly incorporated by reference.

BACKGROUND OF THE INVENTION

The present invention relates to a molded part having an insert therein, specifically to a structure of a molded part integrated with plural metallic terminals by way of insert molding and its production method.

It is required to make the thickness of resin as uniform as possible for making the molded parts in order to prevent the degradation in fluidity and surface property of the resin. However, if the molded part has a portion with an increased thickness, as this increased thickness part has a larger amount of contraction due to the molding process in comparison with the other portions in the molded part, unfavorable void generation inside such an increased thickness portion may be caused when a thickness is larger than a designated limitation value. In case of molded parts having an insert therein, there is such a problem that the contraction of the increased thickness part and the voids generated inside it may increase the gap developed in the interface between the insert and the molded part.

In general, there is a method for molding the resin used for the increased thickness part in a two-layer structure in order to solve the above described problem. In this method, sub parts having a required size are formed in a preliminary molding process, and then, those pre-molded parts are used as inserts, and finally, those inserts are integrated with over-molded parts by way of multiple molding.

In the molded part formed by using the inserts, in the progress of mass production of a wide variety of goods, downsizing and sophisticated configuration of an insert due to higher functionality of parts, there is a limit for increasing the productivity only with a single molding process. In order to solve this problem, sub parts are formed in a preliminary molding process, and then, those pre-molded parts are inserted as insert members, and finally, those parts are integrated with over molded parts by way of multiple molding so that the productivity and the yield rate of the product may be increased. In addition, in terms of higher productivity and low-cost in the molding process, thermoplastic resin is often used as the molded material and an injection molding method is used widely for the molding method in general.

In case of a multiple molding process, a stress due to resin contraction at the over-molding process is applied to the pre-molded part used as an insert, which results in an internal distortion inside the pre-molded part. In addition, a heating process for integrating and molding at the over-molding process may give rise to resin contraction of the pre-molded part. This resin contraction mechanism is different from the contraction of the single body of the pre-molded part and depends on the type and shape of the over-molded part, which may result in such a problem as increasing the gap developed in the interface between the insert and the pre-molded part.

In order to solve the above described problem, in one method, an adhesive material such as epoxy resin is coated and hardened on the exposed surface of the insert after the over-molding process in order to seal the interface between the insert and the pre-molded part, and to further fix firmly the insert and the pre-molded part.

In Japanese Patent Laid-Open No. 7-142817 (1995), a method is disclosed such that epoxy resin composed of an adhesive material having a heat hardening property is coated on an insert for the cover film, and the heat treatment is applied after insert molding in order to bond the insert and the insert molding resin.

This pre-mold process is applied to the insert molding of plural metallic terminals as the insert used for electrical connection.

However, for the same reason described above, in a multiple molding process, a stress due to resin contraction in the over-molding process is applied to the pre-molded part inserted as an insert, which results in an internal distortion inside the pre-molded part. In addition, the heating process for integrating and molding during the over-molding process may give rise to resin contraction of the pre-molded part.

This resin contraction mechanism is different from the contraction of the single body of the pre-molded part and depends on the type and shape of the over-molded part. In applying an insert molding of plural metallic terminals as the insert used for electrical connection, this resin contraction may result in such a problem as increasing the gap developed in the interface between the metallic terminal and the pre-molded part.

In a wire-bonding process in assembly of the product, as such internal distortion and the gap so developed in the molding process disperse and absorb the vibration associated with the bonding process, bonding failure may result.

In order to solve the above described problem, another method provides that an adhesive material such as epoxy resin is coated and hardened on the region of bonding part of the metallic terminal after the over-molding process in order to fix firmly the metallic terminal and the pre-molded part.

As for another solution, the metallic terminal is inserted and pre-molded by using heat-hardening resin, which provides a small amount of post-contraction and is less subject to heat problems in the over-molding process, for the pre-molded part.

SUMMARY OF THE INVENTION

In order to solve the problems due to the increased thickness resin of the molded part used as an insert or to improve the productivity of the molding process, a method is provided in which sub parts having a required size are formed in a preliminary molding process, and then, those pre-molded sub parts are inserted as inserts, and finally, those inserts are integrated with over-molded parts by multiple molding.

In case of a pre-molded part used as an insert, a stress due to resin contraction in the over-molding process is applied to the pre-molded part used as an insert, which results in an internal distortion inside the pre-molded part. In addition, the heating process for integrating and molding during the over-molding process may give rise to resin contraction of the pre-molded part. This resin contraction mechanism is different from the contraction of the single body of the pre-molded part and depends on the type and shape of the over-molded part, which may result in such a problem as making larger the gap developed in the interface between the insert and the pre-molded part.

In order to solve the above described problem, an adhesive material such as epoxy resin is coated and hardened on the exposed surface of the insert after the over-molding process in order to seal the interface between the insert and the pre-molded part, and to further fix firmly the insert and the pre-molded part. However, in this method, a coating process for the epoxy resin is required, and the hardening process for hardening and bonding the epoxy resin after the coating process requires the hardening time of 30 to 60 minutes. In addition, it is required to prepare the coating apparatus and the hardening oven, which may lead to lower productivity and higher cost.

As the viscosity of the epoxy resin decreases extremely before hardening and the epoxy resin takes a liquid form, the hardening shape varies widely due to the epoxy resin flowing in an uncured state, which may result in low reliability when fixing the insert and the pre-molded part.

In another method, the metallic terminal is inserted and pre-molded by using heat-hardening resin, which provides a small amount of post-contraction and is less subject to heat problems in the over-molding process, for the pre-molded part. However, in this method, the material cost for the heat-hardening resin is higher than the thermo setting material, and the reliability of the heat-hardening resin is lower than the reliability of the thermo setting material due to the occurrence of resin flash associated with the heat-hardening resin.

In order to solve the above described problems, an object of the present invention is to provide a composite molded part in which low-cost thermo setting resin is used, an insert molding process using an injection molding method advantageously having a higher efficiency in the molding process is applied, and the interface between the insert and the region around the insert is firmly fixed without forming a gap at the interface therebetween.

Another object of the present invention is to provide an electronic apparatus for increasing the stability in bonding by preventing the generation of the gap which disperses and absorbs the vibration for the product (part) formed by wire bonding in the assembly process after the molding process.

In order to achieve that object, the present invention uses a composite molded part formed by a pre-molded part by pre-molding an insert composed of a composite material composed of metal, ceramic, resin or a combination of those materials or one or more metallic terminals used for electrical contact, which is not limited to this example, as the insert with a pre-molded part composed of thermo plastic resin having crystallinity, and by inserting the pre-molded part into an over-molded part composed of thermo plastic resin and surrounding the pre-molded part with an over-molded part, wherein an insert molding process is applied to a pre-molded part surrounding the pre-molded part to be inserted after applying heat treatment with a temperature lower than a crystalline melting point of the pre-molded part.

It will be appreciated that the composite molded part using the pre-molded part of the present invention can be formed by the insert molding process by using the thermo setting resin and by using the injection molding method, which is advantageous for the efficient molding process, and that the low-cost production method can provide a composite molded part having a high-reliability insert, which can prevent the occurrence of the gap at the interface between the insert and the resin surrounding the insert, so that the contact between the insert and the resin surrounding the insert can be kept.

DETAILED DESCRIPTION OF THE PREFERRED EMBODIMENTS

Now, the problems to be solved by the present invention will be described in detail.

It is required to make the thickness of the resin as uniform as possible for making the molded parts in order to prevent degradation in fluidity and surface property of the resin. However, when the molded part has a portion with an increased thickness, as this increased thickness portion has a larger amount of contraction due to the molding process in comparison with the other portion of the molded part, it may cause unfavorable void generation inside such an increased thickness portion if the contraction is larger than a designated limitation value. In a molded part having an insert therein, the contraction of the increased thickness portion and the voids generated inside it may result in contributing to increasing the gap developed in the interface between the insert and the molded part.

In general, there is a method for molding the resin used for the increased thickness portion in a two-layer structure in order to solve the above described problem, in which sub parts having a required size are formed in a preliminary molding process, and then, those pre-molded sub parts are used as inserts, and finally, those inserts are integrated with over-molded parts by way of multiple molding.

In the molded part formed with the inserts, in the progress of mass production of a wide variety of goods, due to size reduction and sophisticated configuration of an insert due to higher functionality needs, there is a limit for increasing productivity only with a single molding process. Thus, in order to solve this problem in a manner similar to the method described above, sub parts are formed in a preliminary molding process, and then, those pre-molded parts are used as inserts, and finally, those inserts are integrated with over molded parts by way of multiple molding so that the productivity and the yield rate of the product may be increased. In addition, in terms of higher productivity and lower-cost in the molding process, thermoplastic resin is often used as the mold material and an injection molding method is used widely for the molding method in general.

Figure 23:
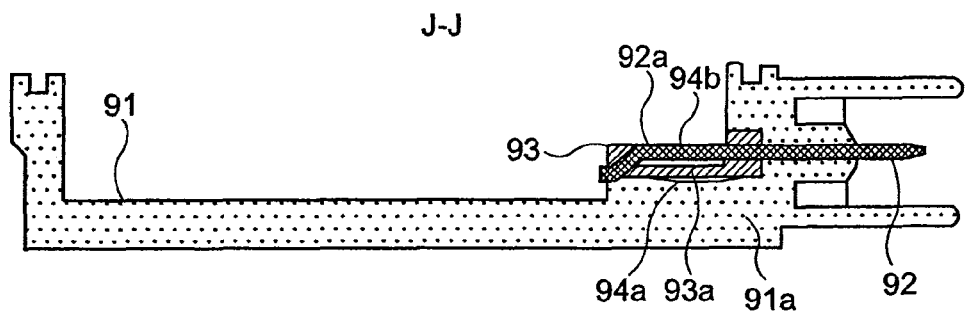
FIG. 23 is a cross-section view illustrating the composite molded part as the molded part having the insert.
Figure 24:
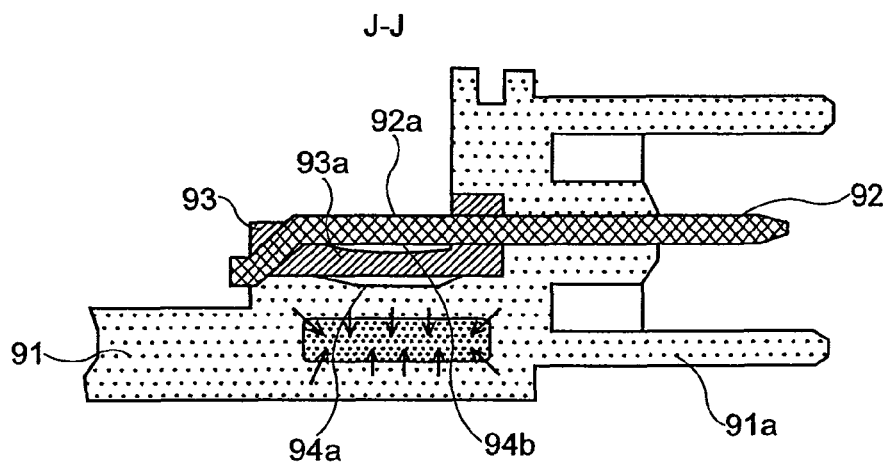
FIG. 24 is a partial cross-section view of the area of the insert of the composite molded part shown in FIG. 23.

A general structure of the molded part having an insert member formed by way of multiple molding processes is shown in FIG. 23 and FIG. 24. FIG. 23 shows the cross-section view of the composite molded part 91 composed of the pre-molded part 93 formed by way of insert molding process with plural metallic terminals 92 and the over-molded part 93a made of resin, and the over-molded part 91a with the pre-molded part 93 inserted therein. FIG. 24 is a magnified view of those aforementioned parts.

In this multiple molding process, the stress due to the resin contraction of the over-molded part 91 is applied to the pre-molded part 93a used as the insert, and the internal distortion occurs inside the pre-molded part 93a. In addition, the heat treatment for integration molding with the over-molded part causes the resin contraction of the pre-molded part 93a, and this resin contraction mechanism is different from the contraction of the single body of the pre-molded part 93 and depends on the type and shape of the over-molded part, which may result in such a problem as increasing the gap 94b developed in the interface between the metallic terminal 92 and the pre-molded part 93a. And furthermore, the gap 94a occurs similarly at the interface between the pre-molded part 93a and the over-molded part 91a.

Figure 25:
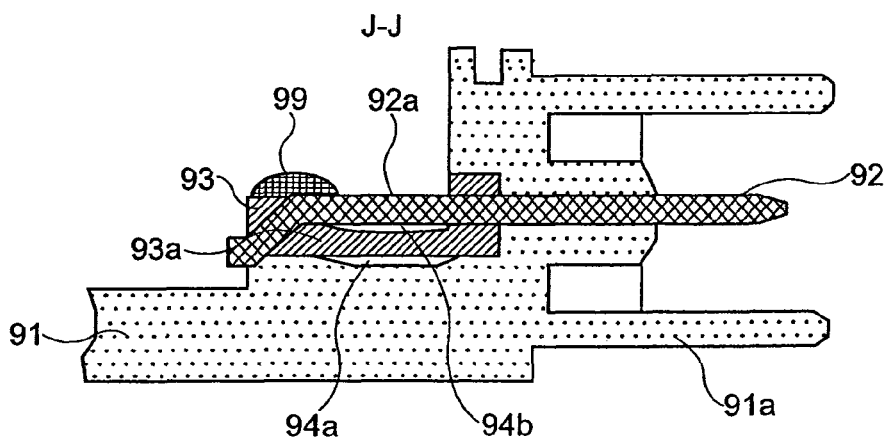
FIG. 25 is a partial cross-section view of the area of the insert of the composite molded part where the insert is composed of an epoxy material.

In order to solve the above described problem, as shown in FIG. 25, a method is provided such that an adhesive material such as epoxy resin 99 is coated and hardened at the electrical bonding part 92a of the metallic terminal 92 after the over-molding process in order to seal the interface between those parts, and to further fix firmly the electrical bonding part 92a and the pre-molded part 93a.

However, in this method, a coating process of the epoxy material 99 such as epoxy resin is required, and the hardening process for hardening and bonding the epoxy material 99 such as epoxy resin after the coating process requires a hardening time of 30 to 60 minutes. In addition, it is required to prepare the coating apparatus and the hardening oven, which may lead to lower productivity and higher cost. And furthermore, as the viscosity of the epoxy material 99 decreases extremely before hardening and the epoxy resin takes on liquid form, the hardening shape varies widely due to the epoxy resin flowing in an uncured state, which may result in the low reliability in fixing the electrical bonding part 92a and the pre-molded part 93a.

As for another method, the metallic terminal is inserted and pre-molded by using heat-hardening resin, which provides a small amount of post-contraction and is less subject to heat problems in the over-molding process, for the pre-molded part. However, in this method, there are such problems that the material cost for the heat-hardening resin is higher than the thermo setting material, and that the reliability of the heat-hardening resin is lower than the reliability of the thermo setting material due to the occurrence of resin flash associated with the heat-hardening resin.

In order to solve the above problems, a composite molded part formed by forming a pre-molded part by pre-molding an insert composed of a composite material such as metal, ceramic, resin or a combination of those materials or one or more metallic terminals used for electrical contact, which is not limited to this example, as the insert with a pre-molded part composed of thermo plastic resin having crystallinity, and by inserting the pre-molded part into an over-molded part composed of thermo plastic resin and surrounding the pre-molded part with an over-molded part, wherein an insert molding process is applied to an pre-molded part surrounding the pre-molded part to be inserted after applying heat treatment with a temperature lower than a crystalline melting point of the pre-molded part.

One embodiment of the present invention is characterized by the plural pre-molded parts being inserted simultaneously and molded together with the over-molded part.

Another embodiment of the present invention is characterized by the pre-molded parts being superposed and then inserted simultaneously, and molded together with the over-molded part.

Yet another embodiment of the present invention is characterized by the pre-molded part and the over-molded part composed of thermo setting resin having crystallinity being composed of the resin having the common base material and filled with the filler.

Another embodiment of the present invention is characterized by the pre-molded part and the over-molded part composed of thermo setting resin having crystallinity being composed of the resin having common base material and filled with the filler, and the pre-molded part being composed of the resin having a filler filling factor higher than that of the resin used for the over-molded part.

Another embodiment of the present invention is characterized by the pre-molded part and the over-molded part composed of thermo setting resin having crystallinity being composed of the resin having common base material and filled with the filler, and the pre-molded part being composed of the resin having a crystalline melting point higher than that of the resin used for the over-molded part.

Another embodiment of the present invention is characterized by the pre-molded part and the over-molded part composed of thermo setting resin having crystallinity being composed of the resin having the common base material and filled with the filler, and the pre-molded part being composed of the resin having the crystalline melting point equivalent to or higher than that of the resin used for the over-molded part, and having the fusibility with the over-molded part.

And furthermore, another embodiment of the present invention is characterized by an electronic apparatus having an electronic part arranged inside the composite molded part with plural terminals inserted therein used for connecting electrically to the outside, in which the composite molded part is composed of a configuration as described above.

Embodiments of the present invention will be described in detail by referring to the attached figures. Note that the present invention is not limited to the following embodiments.

Embodiment 1

Figure 1:
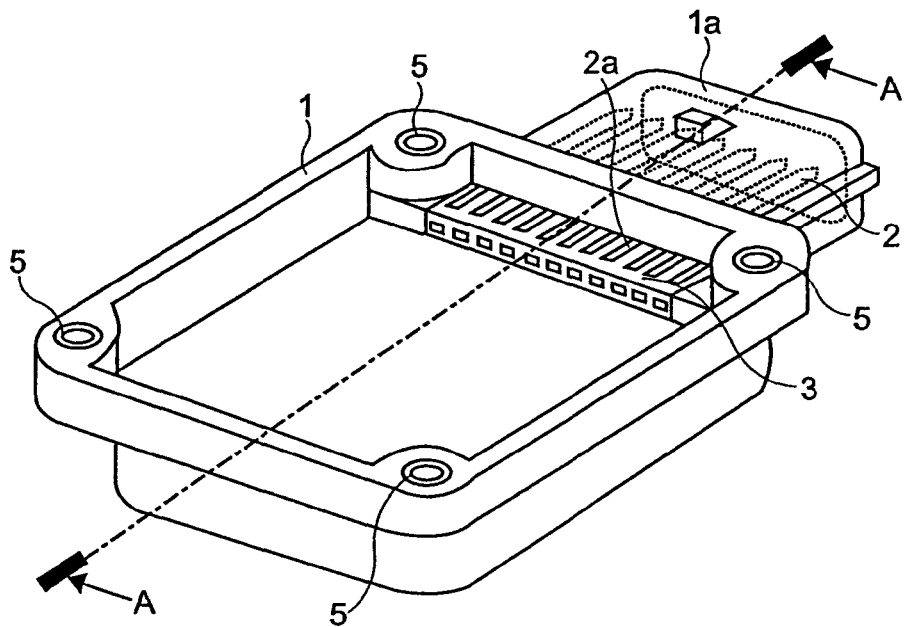
FIG. 1 is an isometric view illustrating the composite molded part as embodiment 1 of the molded part having the insert according to the present invention.
Figure 2:
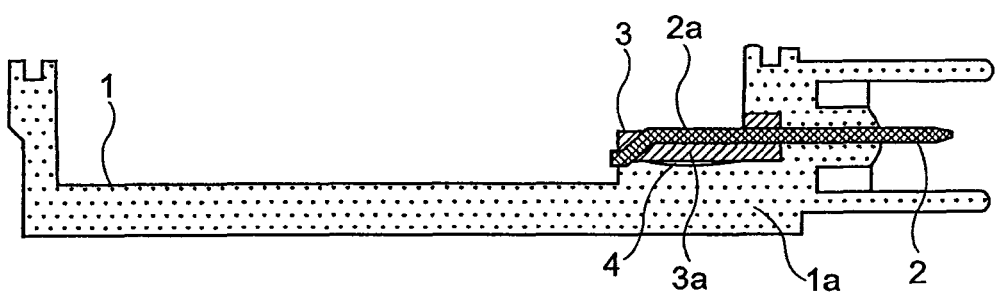
FIG. 2 is a cross-section view along line A-A of the composite molded part of embodiment 1 according to the present invention.
Figure 3:
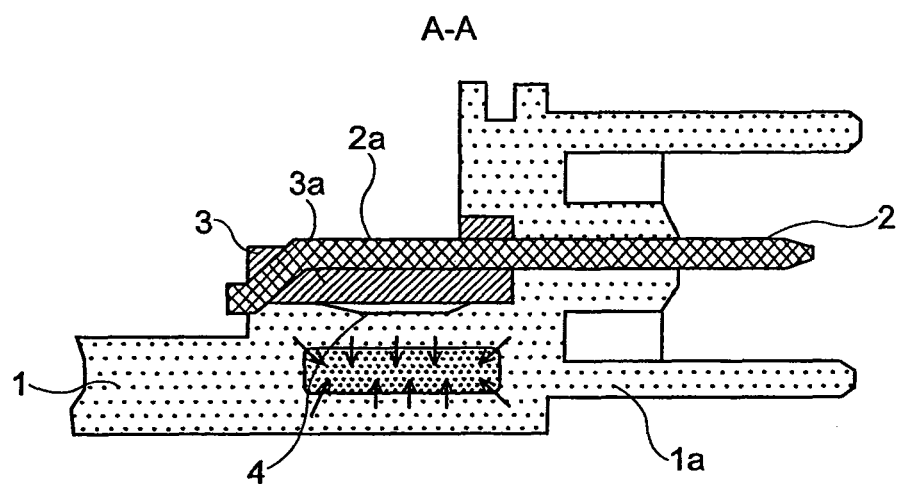
FIG. 3 is a partial cross-section view also along line A-A but of the region of the insert in the composite molded part as embodiment 1 according to the present invention.

FIG. 1 shows an isometric view of the composite molded part 1 as the molded part having the insert used for the electronic apparatus in this embodiment. The composite molded part 1 is a composite molded part formed by inserting the pre-molded part 3 as the insert into the over-molded part 1a and molding together with the over-molded part 1a, composed of the thermo setting resin, surrounding the pre-molded part 3. As for another insert, a bush 5 to be used for mounting at the main body is also molded together with the over-molded part 1a.

The pre-molded part 3 is formed as the metallic terminal 2 configured as plural Cu-based metallic plates with a thickness of 0.6 to 1.00 mm and with a width of 2 to 3 mm, on the surface of which metallic deposit is formed with nickel, tin or gold used for electrical connection in order to develop the electrical conjunction and contact property and a corrosion protection property, and those metallic terminals are used as the insert into the pre-molded part 3a composed of the thermo setting resin having crystallinity. In the pre-molded part 3 formed by applying the pre-molding process to the metallic terminal 2 used for electrical connection with the pre-molded part 3a, this embodiment applies heat treatment in advance to the pre-molded part 3a with the temperature lower than the crystalline melting point of the pre-molded part 3a.

As for the material used for the pre-molded part 3a, polyester resin such as polybutylene terphthalate resin (PBT resin), and thermoplastic resin having crystallinity such as polyphenylene sulfide resin (PPS resin), polyamide resin (PA resin), polyacetal resin (POM resin) and polyethylene resin (PE resin) and compound resin formed by filling glass fiber as inorganic material, carbon fiber as organic material, or metallic material into those resin materials can be used.

As for the material used for the over-molded part 1a, in addition to resin materials able to be used for the pre-molded part, thermoplastic resin having an amorphous property such as polycarbonate resin (PC resin), polystyrene resin (PS resin) and ABS resin, thermo setting resin such as epoxy resin and phenol resin, and compound resin formed by filling glass fiber as inorganic material, carbon fiber as organic material, or metallic material into those resin materials can be used.

In the following example, a material formed with polybutylene terphthalate resin filled with glass fiber by 40% is the material used for both of the pre-molded part 3a and the over-molded part 1a.

Figure 4:
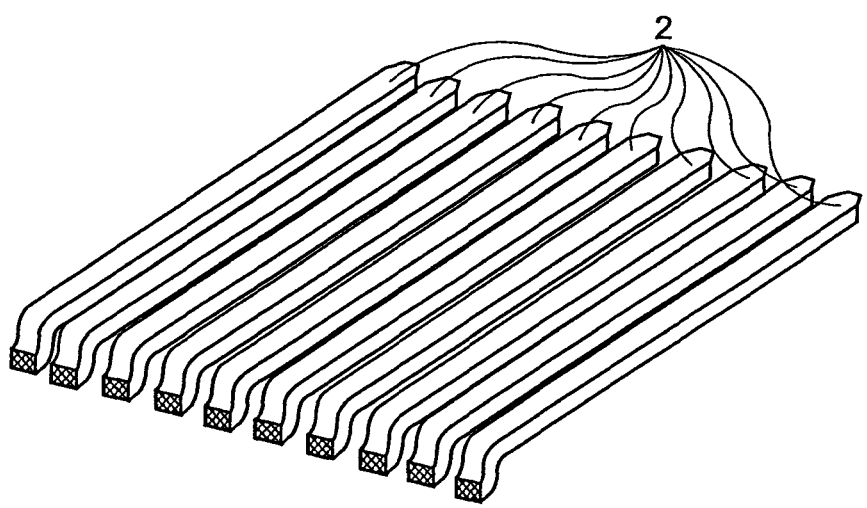
FIG. 4 is an isometric view illustrating the insert of the pre-molded part according to embodiment 1 of the present invention.
Figure 5:
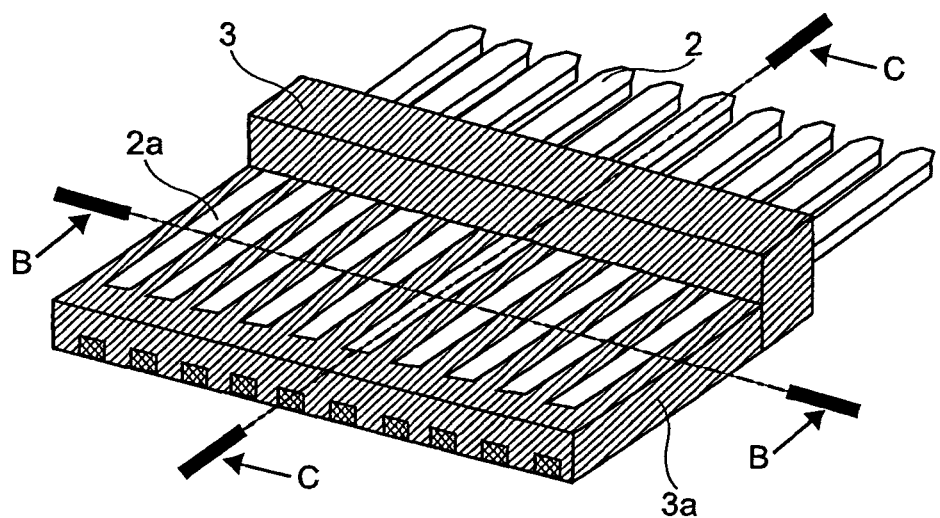
FIG. 5 is an isometric view of the pre-molded part according to embodiment 1 of the present invention.
Figure 6:
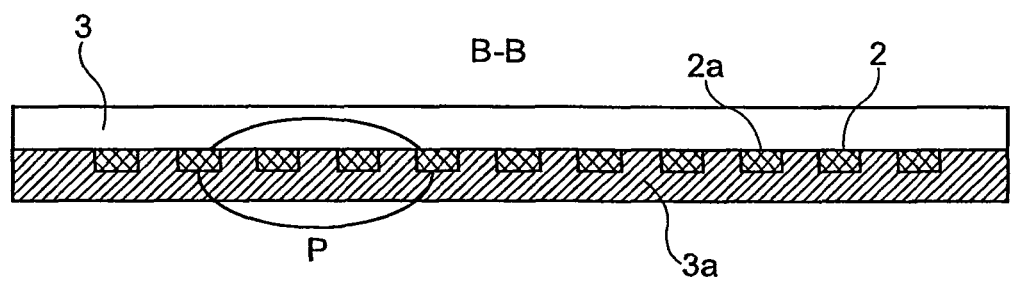
FIG. 6 is a horizontal cross-section view along line B-B in FIG. 5 of the pre-molded part according to embodiment 1 of the present invention.
Figure 7:
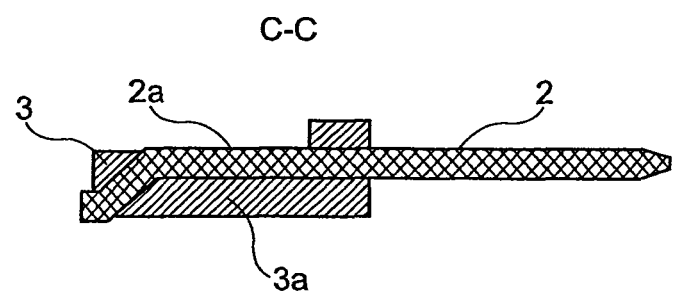
FIG. 7 is a vertical cross-section view along line C-C in FIG. 5 of the pre-molded part according to embodiment 1 of the present invention.

The basic structure of the composite molded part 1 is described above, and the production method in the embodiment shown by FIG. 1 is now described below. At first, the pre-molded part 3 is formed by inserting the plural metallic terminals 2 shown in FIG. 4 into a designated position of the die assembly, not explicitly shown in the figure, with temperature increased by 40 to 100° C., and the metallic terminals 2 are fixed by the moving die assembly, the fixed die assembly and the clamp using slide pieces. By means of injection molding method, the molding resin fused at the heater temperature, 220° C. to 270° C., of the molding machine is made to flow through the spool, the runner and the gate inside the die assembly and filled into the spatial cavity in order to form the pre-molded part 3. Concurrently with this filling operation, the pre-molded part 3a formed as fused resin material is cooled and solidified immediately inside the die assembly, and then the finished pre-molded part 3 can be obtained by being released from the die assembly and pushed out from the die assembly with the knockout pin. The horizontal cross-section view of the pre-molded part is shown in FIG. 6, and the vertical cross-section view of the pre-molded part is shown in FIG. 7. In this embodiment, after molding the pre-molded part 3a, heat treatment is particularly applied to the pre-molded part 3a in the high temperature reservoir at 150° C. lower than the crystalline melting point of the pre-molded part 3a from 220° C. to 270° C. in about 1 hour. The pre-molded part 3 with heat treatment applied is used as the insert, and then, the over-molding processing is applied for filling the over-molded part 1a into the spatial cavity in order to molded the composite molded part 1 as the over-molded part inside the die assembly with the fused molding resin heated in the heater temperature, 220° C. to 270° C., of the molding machine by injection molding method similar to the pre-molding processing. Then, after the composite molded part 1 as the over-molded part is cooled and solidified, the finished composite molded part 1 as the over-molded part can be obtained by being pushed out from the die assembly with the knockout pin.

Figure 8:
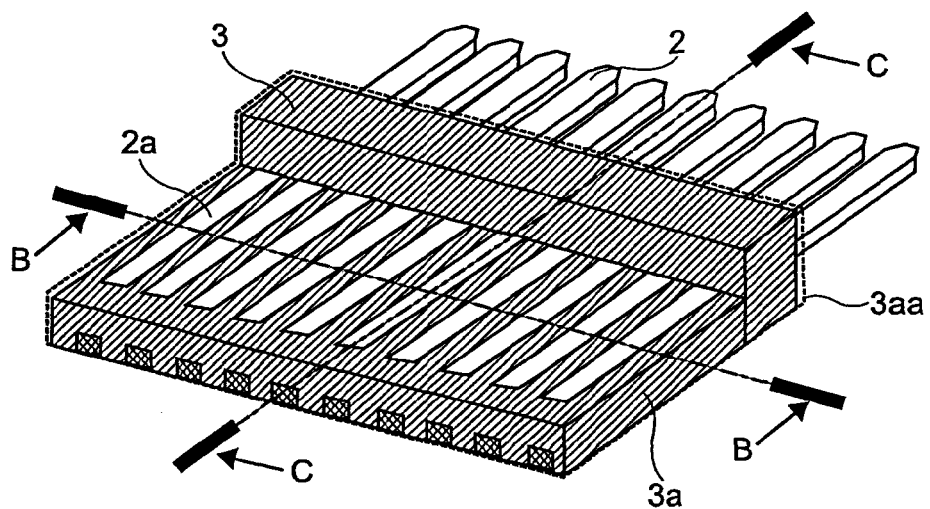
FIG. 8 is an isometric view of the pre-molded part when the resin contraction occurs according to embodiment 1 of the present invention.
Figure 9:
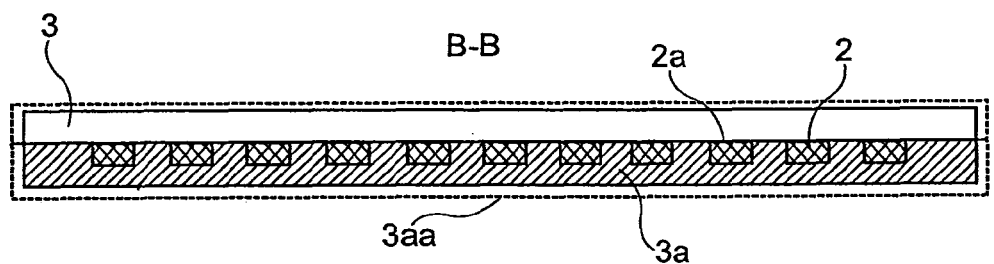
FIG. 9 is a horizontal cross-section view along line B-B in FIG. 8 of the pre-molded part when the resin contraction occurs according to embodiment 1 of the present invention.
Figure 10:
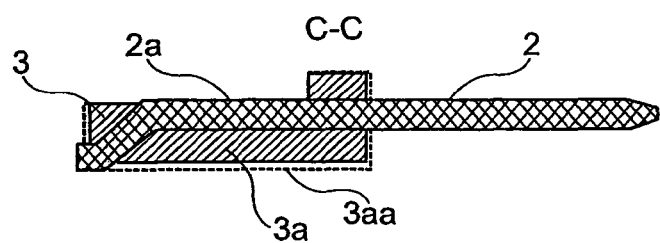
FIG. 10 is a vertical cross-section view along line C-C in FIG. 8 of the pre-molded part when the resin contraction occurs according to embodiment 1 of the present invention.
Figure 32:
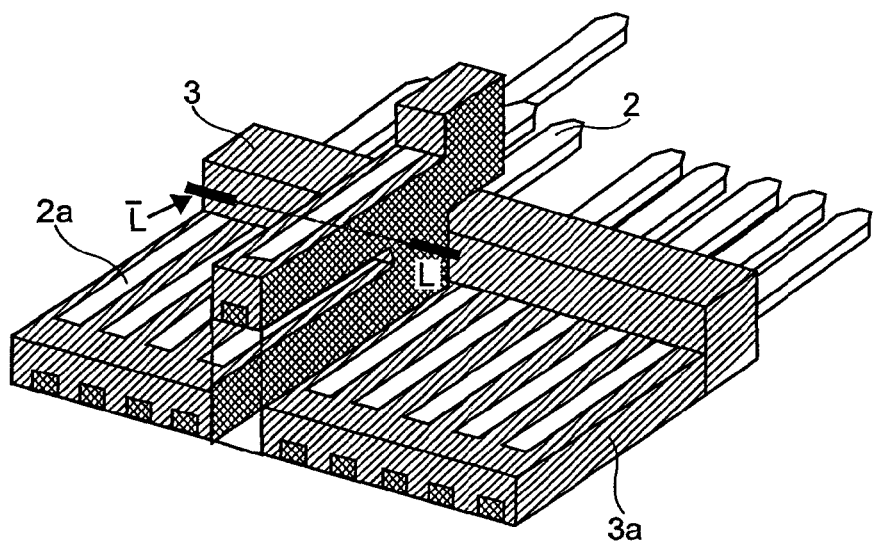
FIG. 32 is an isometric view of the pre-molded part according to embodiment 1 of the present invention.
Figure 33:
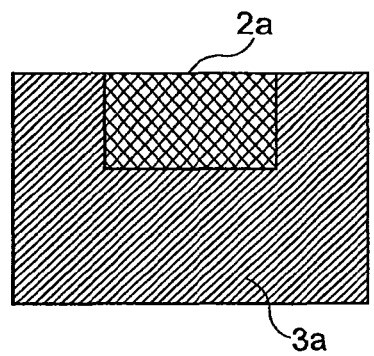
FIG. 33 is a partial cross-section view of the pre-molded part according to embodiment 1 of the present invention.
Figure 34:
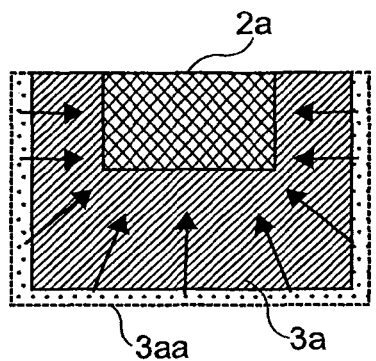
FIG. 34 is a partial cross-section view of the pre-molded part when the resin contraction occurs according to embodiment 1 of the present invention.

The pre-molded part 3a surrounds continuously the metallic terminals 2 which are formed as plural metallic terminals 2 adjacent to one another, and the electrical connection part 2a of the individual metallic terminal 2 is exposed onto the surface of the pre-molded part 3a made of resin material. As shown in FIG. 32 and FIG. 33, as a single body of the individual metallic terminal 2, at the entire perimeter of the electrical connection part 2a, the pre-molded parts 3a formed with the resin material having the thickness 2 to 3 mm on the opposite surface of the electrical connection surface are arranged without intervals, and the pre-molded part 3a made with the same resin material surrounds the electrical connection part 2a without intervals also on the vertical surfaces to the electrical connection surface. In this embodiment, after molding the pre-molded part 3a, heat treatment is particularly applied to the pre-molded part 3a in the high temperature reservoir at 150° C. lower than the crystalline melting point of the pre-molded part 3a from 220° C. to 270° C. in about 1 hour. Owing to this heat treatment, the internal distortion caused during the molding process in the pre-molded part 3aa before heat treatment can be released and the crystallization of the pre-molded part 3aa can be accelerated, which leads to the contraction of the pre-molded part 3a in the direction so as to fasten the metallic terminals 2 as shown in FIG. 34. As this contraction behavior is developed throughout the pre-molded part 3 as well as the above described part locally, the pre-molded part 3 is contracted due to heat treatment. This contraction behavior is shown in FIG. 8 to FIG. 10. The interface between the metallic terminal 2 and the pre-molded part 3a is contacted firmly to each other without intervals in comparison with the structure before heat treatment, and as the molecular structure in the pre-molded part 3a is stabilized due to the development of crystallization, the rigidity of the pre-molded part 3a against time-dependent variability and deformation due to the thermal external force applied by the over-molded part 1a can be increased more significantly than the structure before heat treatment.

This embodiment is not limited to the condition for heat treatment described above, but another condition such as the treatment temperature from 130 to 170° C. and the heating time for 1 to 4 hours can contribute to the same and satisfactory performance.

In addition, as for the thickness of the pre-molded part 3a made of resin arranged on the opposite surface of the electrical connection surface, 2 to 3 mm thickness for PBS resin as used in this embodiment provides the best performance; in contrast, smaller thickness reduces the throughout rigidity of the pre-molded part 3, which results in the distortion and deformation intolerable to the material filling pressure and the resin contraction. On the other hand, larger thickness causes voids generated inside the pre-molded part 3a made of resin, and this void generation accelerates remarkably the resin expansion and contraction, which leads to making larger the gap in the interface between the metallic terminal 2 and the pre-molded part 3a made of resin.

In the composite molded part 1 formed by inserting the pre-molded part 3 with heat treatment applied and by over-molding process, it will be appreciated that the gap 4 may be developed between the pre-molded part 3a and the over-molded part 21a but there is no gap generated between the metallic terminal 2 and the pre-molded part 3a even when the resin contraction in the over-molded part 1a develops.

Figure 11:
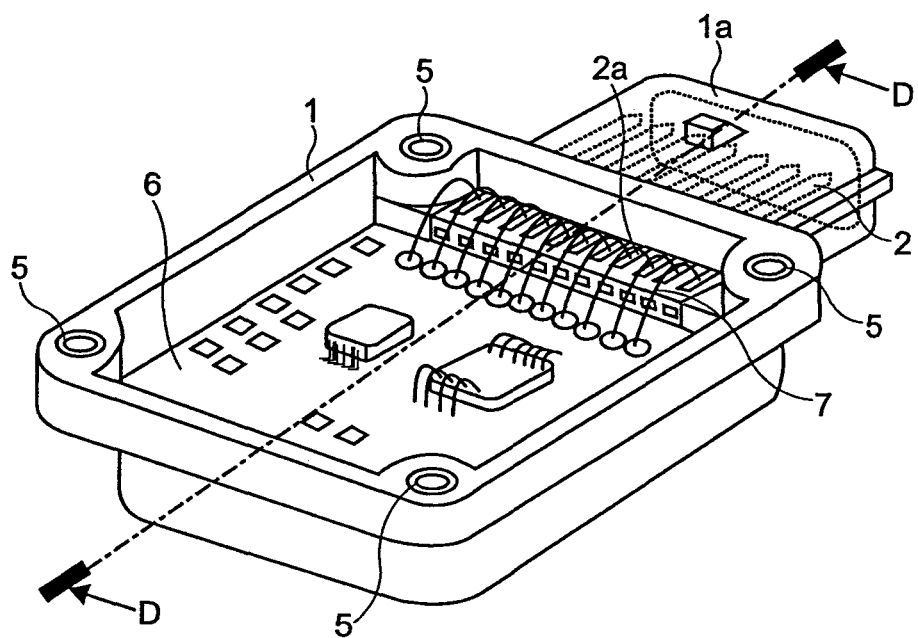
FIG. 11 is an isometric view of the composite molded part when the electronic part is mounted according to embodiment 1 of the present invention.
Figure 12:
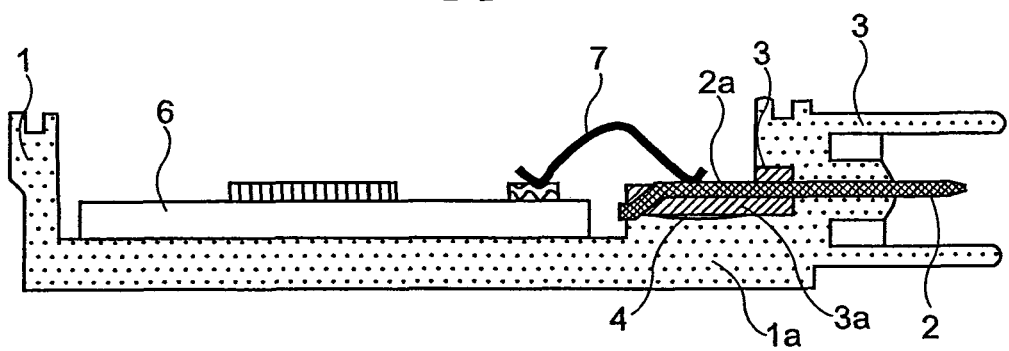
FIG. 12 is a cross-section isometric view along line D-D in FIG. 11 of the composite molded part when the electronic part is mounted according to embodiment 1 of the present invention.
Figure 35:
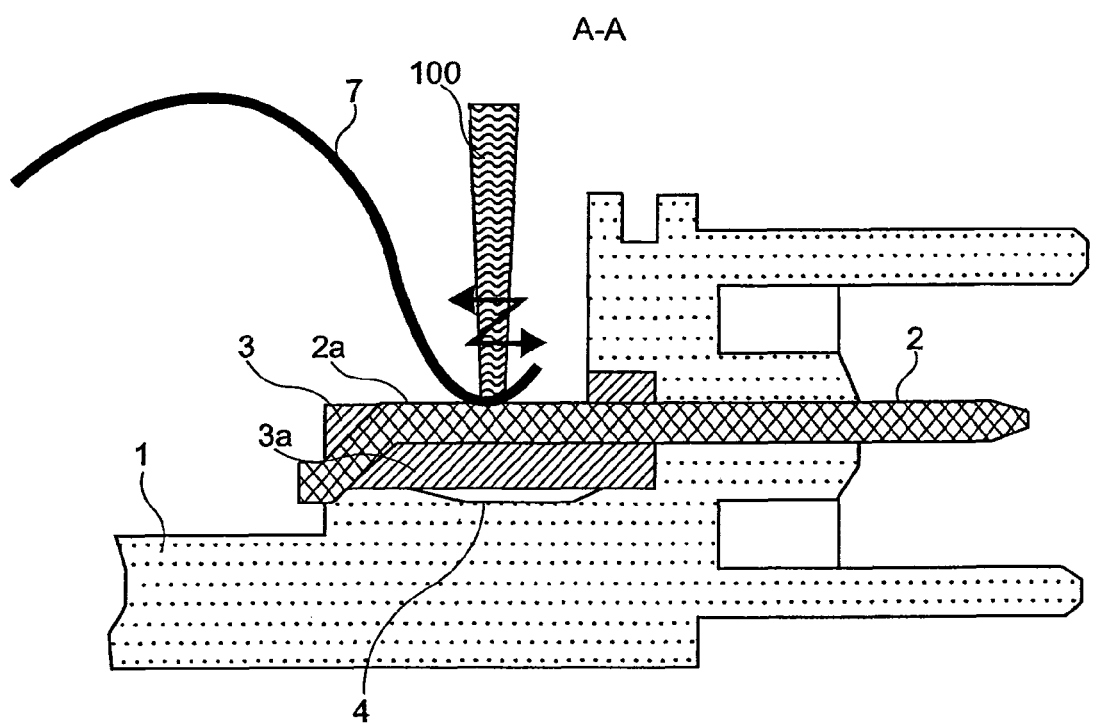
FIG. 35 is a cross-section view of the composite molded part during the wire bonding process according to embodiment 1 of the present invention.

The isometric view of the configuration in which the electronic part 6 is arranged at the designated position inside the composite molded part 1 and the electrical connection part 2a of the metallic terminal 2 and the electronic part 6 are bonded by the aluminum wire 7 is shown in FIG. 11 and its cross-section view is shown in FIG. 12. As also shown in FIG. 35, the aluminum wire 7 is overlapped onto the electrical contact part surface 2a, and then, the bonding apparatus 100 presses down the aluminum wire 7 onto the surface of the electrical connection part 2a. The aluminum wire 7 and the electrical connection part 2a are then bonded to each other by the friction heat induced by the ultrasonic vibration generated by the bonding apparatus 100. In this process, if there exists a gap in the interface between the lower part of the electrical connection part 2a and the pre-molded part 3a, the ultrasonic vibration energy used for bonding process is dispersed and the friction heat required for bonding process can not be generated, which results in a bonding defect. However, in the composite molded part 1 of this embodiment, the metallic terminal 2 and the pre-molded part 3a can be contacted more firmly to each other without a gap generated between the metallic terminal 2 and the pre-molded part 3a than before heat treatment at the pre-molded part 3 alone, which can lead to the establishment of stable bonding performance without ultrasonic vibration energy dispersion at the bonding process.

Figure 13:
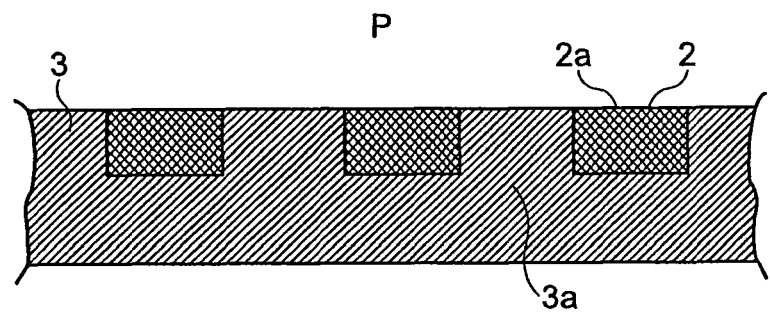
FIG. 13 is a partial cross-section view of the pre-molded part according to embodiment 1 of the present invention.
Figure 14:
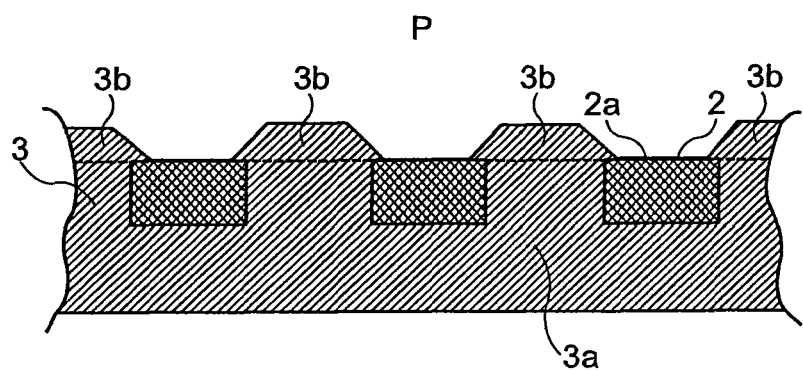
FIG. 14 is a partial cross-section view of the pre-molded part according to embodiment 1 of the present invention.
Figure 15:
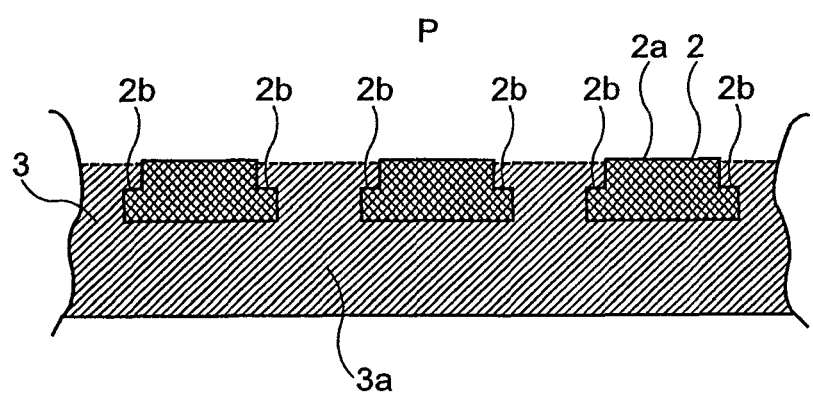
FIG. 15 is a partial cross-section view of the pre-molded part according to embodiment 1 of the present invention.

The shapes of the electrical connection part 2a of the metallic terminal 2 and the pre-molded part 3a so formed as to accelerate the crystallization of the pre-molded part 3a by applying the above described heat treatment to the pre-molded part 3a and contacting firmly the interface between the metallic terminal 2 and the pre-molded part 3a is not limited to the shape shown by the cross-section view illustrated in FIG. 13, but it will be appreciated that the same effect can be obtained also by forming the protruding surface of the resin material 3b at both end parts of the surface of the electrical connection part 2a adjacent to the pre-molded part 3a as shown in FIG. 14. It may be allowed also that the protruding part 2b of the metallic terminal is formed at the both end parts of the electrical connection part 2a below the surface of the electrical connection part 2a of the metallic terminal 2.

Embodiment 2

Figure 20:
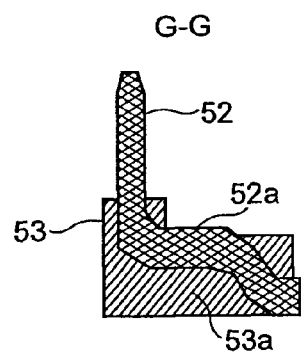
FIG. 20 is a cross-section view of the pre-molded part according to embodiment 2 of the present invention.
Figure 21:
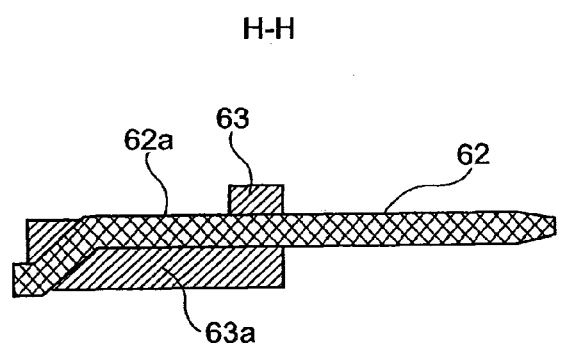
FIG. 21 is a cross-section view of the pre-molded part according to embodiment 2 of the present invention.
Figure 22:
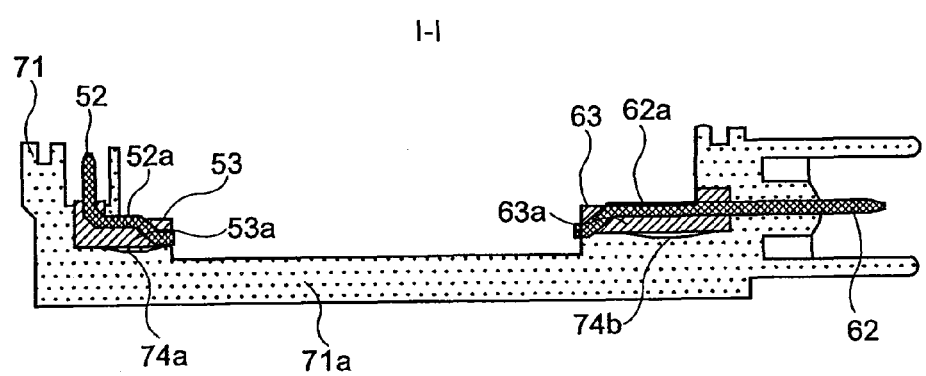
FIG. 22 is a cross-section view of the composite molded part according to embodiment 2 of the present invention.

FIG. 22 shows a cross-section view of the composite molded part 71 as the molded part having the insert used for the electronic apparatus in this embodiment, the composite molded part 71 being formed by inserting simultaneously a couple of pre-molded parts 53 and 63 shown in FIG. 20 and FIG. 21, respectively, and molding with the over-molded part 71a. This composite molded part 71 is composed in the following manner, and based on the same principle as the embodiment 1. The metallic terminals 52 and 62 are configured as plural Cu-based metallic plates with a thickness of 0.6 to 1.00 mm and with a width of 2 to 3 mm on the surface of which metallic deposit is formed with nickel, tin or gold used for electrical connection in order to develop the electrical conjunction and contact property and the corrosion protection property. Those metallic terminals are used as the insert into the pre-molded parts 53a and 63a composed of the thermo setting resin having crystallinity, and then the pre-molded parts 53 and 63 are formed by applying the pre-molding process to the metallic terminals 52 and 62 with the pre-molded parts 53a and 63a. The heat treatment is applied to the individual pre-molded parts 53a and 63a in the high temperature reservoir at 150° C. lower than the crystalline melting point of the pre-molded parts 53a and 63a in about 1 hour. Next, the pre-molded parts 53 and 63 are used as inserts to the over-molded part 71a, and finally the composite molded part 71 is obtained by molding the pre-molded parts 53 and 63 with the over-molded part 71a composed of PBT resin composed of thermo setting material.

Owing to this heat treatment, the internal distortion in the individual pre-molded parts 53 and 63 can be released and the crystallization can be accelerated, which leads to contraction of the pre-molded parts 53 and 63 in a direction so as to fasten the metallic terminals 52 and 62. Therefore, also in the composite molded part 71 formed by over-molding, even if the gaps 74a and 74b might be developed between the pre-molded parts 53*a* and 63*a* and the over-molded part 71*a*, it will be appreciated that there is no gap generated between the metallic terminals 52 and 62 and the pre-molded parts 53*a* and 63*a*, which can establish stable bonding performance at the bond.

Embodiment 3

Figure 16:
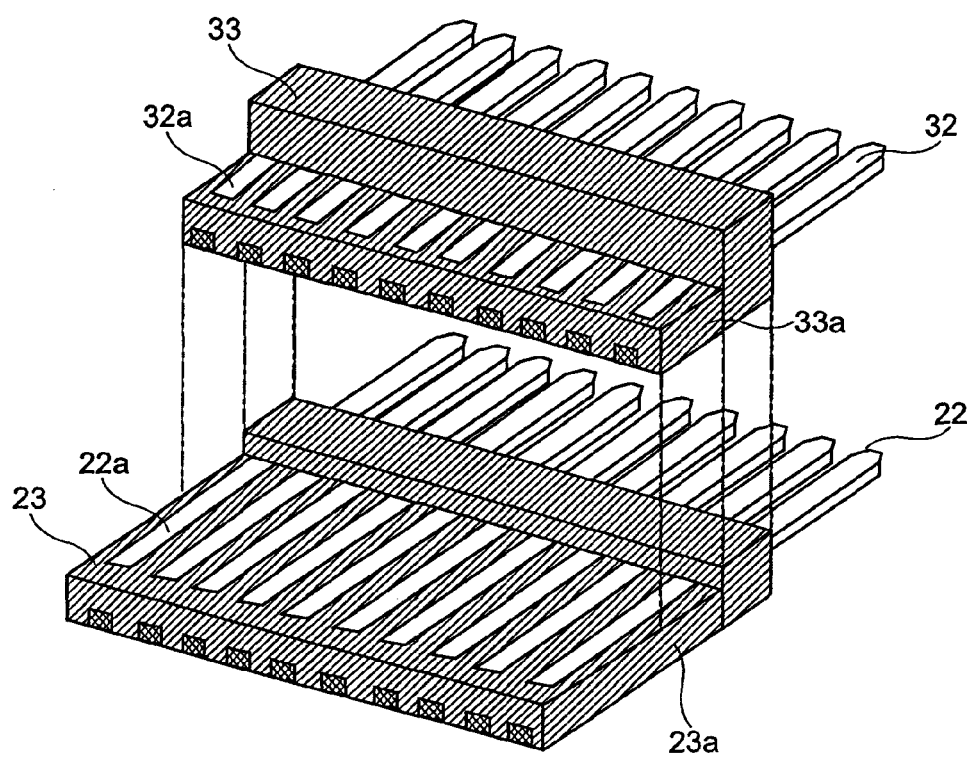
FIG. 16 is an isometric view of the pre-molded part before engaging parts according to embodiment 3 of the present invention.
Figure 17:
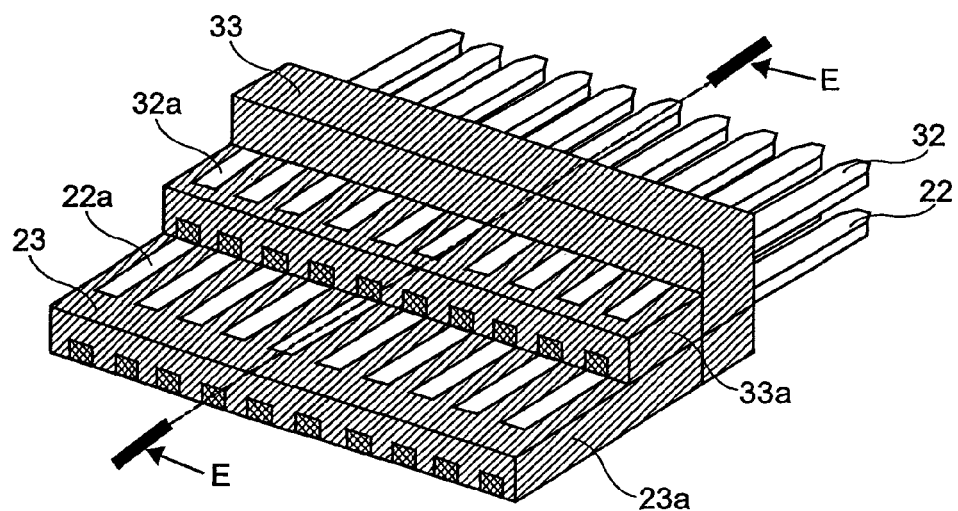
FIG. 17 is an isometric view of the pre-molded part after engaging parts according to embodiment 3 of the present invention.
Figure 18:
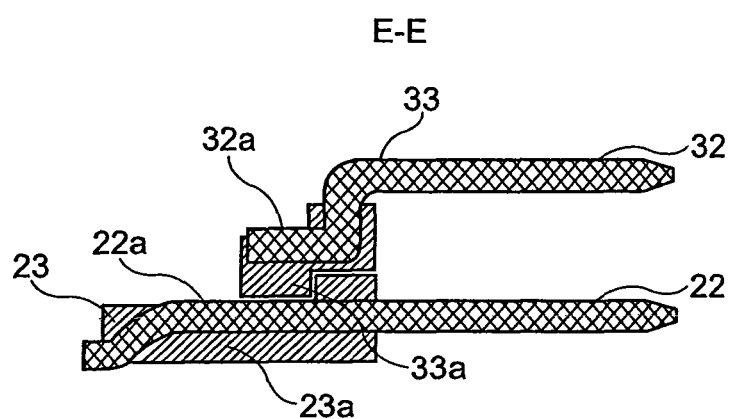
FIG. 18 is a cross-section view along line E-E in FIG. 17 of the pre-molded part after engaging parts according to embodiment 3 of the present invention.
Figure 19:
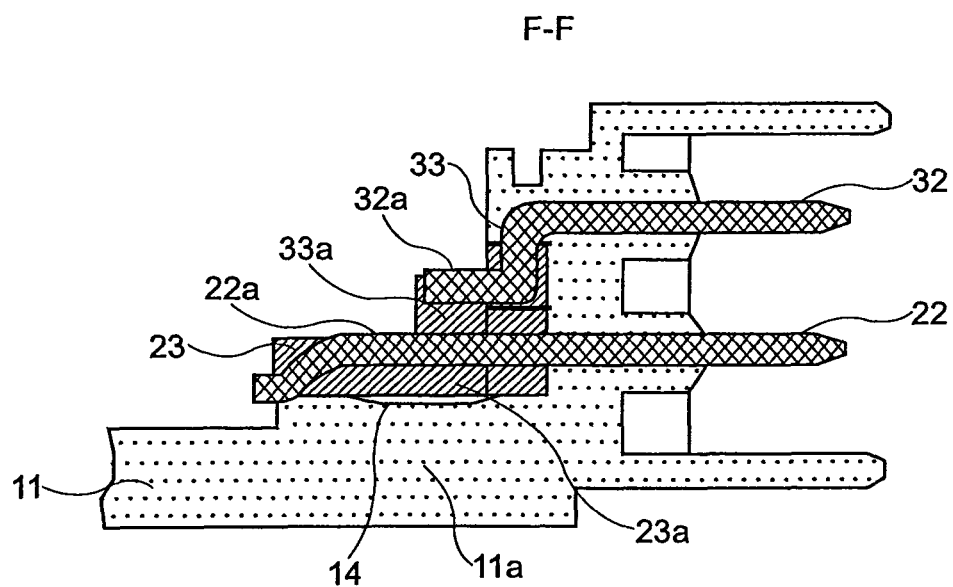
FIG. 19 is a cross-section view of the area of the insert of the composite molded part according to embodiment 3 of the present invention.

FIG. 19 shows a partial cross-section view of the composite molded part 11 as a molded part having the insert used for the electronic apparatus in this embodiment, the composite molded part 11 being formed by superposing and inserting simultaneously a couple of pre-molded parts 23 and 33 shown in FIG. 16, FIG. 17 and FIG. 18, respectively, and molding with the over-molded part 11*a*. This composite molded part 11 is composed in the following manner, and based on the same principle as the above described embodiments.

The metallic terminals 22 and 32 are configured as plural Cu-based metallic plates with a thickness of 0.6 to 1.0 mm and with a width of 2 to 3 mm on the surface of which metallic deposit is formed with nickel, tin or gold used for electrical connection in order to develop the electrical conjunction and contact property and the corrosion protection property. Those metallic terminals are inserted as the insert member into the pre-molded parts 23*a* and 23*a* composed of the thermo setting resin having crystallinity, and then the pre-molded parts 53 and 63 are formed by applying the pre-molding process to the metallic terminals 22 and 32 with the pre-molded parts 23*a* and 33*a*. The heat treatment is applied to the individual pre-molded parts 23*a* and 33*a* in the high temperature reservoir at 150° C. lower than the crystalline melting point of the pre-molded parts 23*a* and 33*a* in about 1 hour. Next, the pre-molded part 33 is overlapped above the pre-molded part 23 as shown in FIG. 12 and FIG. 17, and the overlapped pre-molded parts 23 and 33 are used as inserts, and finally the composite molded part 11 is obtained by molding the over-molded part 11*a* with PBT resin composed of thermo setting material surrounding the pre-molded parts 23 and 33.

In this embodiment, by separating the pre-molded parts for the metallic terminals 22 and 32 formed as the multi stage and for the pre-molded part having larger thickness, it will be appreciated that the pre-molded parts 23*a* and 33*a* can be contracted in the direction so as to fasten the metallic terminals 22 and 32, respectively, and the void generation inside the pre-molded part can be prevented.

Owing to this heat treatment, the internal distortion caused during the molding process in the pre-molded parts 23 and 33 can be relaxed, the crystallization of the pre-molded part 33*a* can be accelerated, and the molecular structure can be stabilized, which leads to the improvement of the rigidity of the pre-molded parts 23*a* and 33*a* against the deformation stress after the heat treatment.

Therefore, also in the composite molded part 11 formed by over-molding, even if the gap 14 might be developed between the pre-molded part 23*a* the over-molded part 11*a*, it will be appreciated that there is no gap generated between the metallic terminals 52 and 62 and the pre-molded parts 23*a* and 33*a*, which establishes stable bonding.

Embodiment 4

Though not shown explicitly, the materials used for the pre-molded part and the over-molded part are not limited to those used in this embodiment but can be selected from any combination of resin materials. In the embodiment 1, such a common material as PBT resin composed of heat setting material filled with glass fiber by 40% is used for both of the pre-molded part and the over-molded part. In contrast, in the embodiment 4, glass fiber is filled by 50% in the pre-molded part and glass fiber is filled by 40% in the over-molded part so that the filler fraction in the pre-molded part is higher than the filler fraction in the over-molded part.

In a manner similar to embodiment 1, the metallic terminal is used as an insert and molded with the pre-molded part filled with the above described glass fiber by 50%, and then, the heat treatment is applied to the pre-molded part in the high temperature reservoir at 150° C. lower than the crystalline melting point of the pre-molded part, and finally, the pre-molded part completed with the heat treatment is inserted as the insert, and molded with the over-molded part composed of glass fiber by 40%.

As glass fiber is filled into the resin material for the purpose of increasing the rigidity of resin material, the rigidity of the pre-molded part can be increased by making the fraction of glass fiber in the pre-molded part higher than the fraction of glass fiber in the over-molded part, and this configuration is effective against the deformation stress by establishing the rigidity and in view of resin contraction behavior of the over-molded part. Thus, higher rigidity in the area of the connection part at the bonding can be established which leads to stable bonding performance.

Embodiment 5

In the previous embodiments, such a common material as PBT resin composed of heat setting material is used for both the pre-molded part and the over-molded part. In contrast, in embodiment 5, the material used at the pre-molded part is different from the material used at the over-molded part, but those resin materials are filled with filler, and the pre-molded part and the over-molded part are so configured that PPS resin composed of thermo setting resin, having a crystalline melting point higher than the over-molded part, filled with glass fiber by 60% is used for the material of the pre-molded part, and that PBT resin composed of thermo setting resin filled with glass fiber by 40% is used for the material of the over-molded part.

In a manner similar to embodiment 1, the metallic terminal is inserted as an insert and molded with the pre-molded part composed of PPS resin filled with the above described glass fiber by 60%, and then, the heat treatment is applied to the pre-molded part in the high temperature reservoir at 170° C. lower than the crystalline melting point of the pre-molded part. Finally, the pre-molded part completed with the heat treatment is inserted as the insert and molded with the over-molded part composed of PBT resin filled with the above described glass fiber by 40%.

As described in embodiment 4, as the filler fraction of glass fiber in the pre-molded part is higher, it will be appreciated that the rigidity of the pre-molded part is sufficient and the resin contraction behavior of the over-molded part is well established and stable bonding performance can be provided. In addition, as the crystalline melting point of the pre-molded part is higher than the over-molded part, it will be appreciated that the heat effect against the pre-molded part can be reduced when heating and molding the over-molded part.

Embodiment 6

In embodiment 6, a common material such as PBT resin composed of heat setting material is used for both the pre-molded part and the over-molded part, and the pre-molded part and the over-molded part are so configured that resin filled with glass fiber by 50% is used for the pre-molded part and resin filled with glass fiber by 30% is used for the pre-molded part whereby the resin combination as the filler fraction in the pre-molded part is higher than the filler fraction in the over-molded part, and that the pre-molded part has a crystalline melting point lower than the over-molded part.

In a manner similar to embodiment 1, the metallic terminal is inserted and molded with the pre-molded part filled with the above described glass fiber by 50%, then, the heat treatment is applied to the pre-molded part in the high temperature reservoir at 150° C. lower than the crystalline melting point of the pre-molded part, and finally, the pre-molded part completed with the heat treatment is inserted, and molded with the over-molded part composed of glass fiber by 30%.

As the crystalline melting point of the pre-molded part is lower than the over-molded part, the surface of the pre-molded part due to heating when molding the over-molded part is melted with a micron order thickness, and this melted part is fused with a part of the over-molded part, cooled and solidified. Thus, it will be appreciated that such a composite molded part has no gap generated at the interface between the pre-molded part and the over-molded part. The above described method is effective for the composite molded part which requires the firm contact between the pre-molded part and the over-molded part.

As described also in embodiment 4, as the filler fraction of glass fiber in the pre-molded part is higher, it will be appreciated that the rigidity of the pre-molded part is sufficient and the resin contraction behavior of the over-molded part is well established and stable bonding performance can be provided.

Embodiment 7

Figure 26:
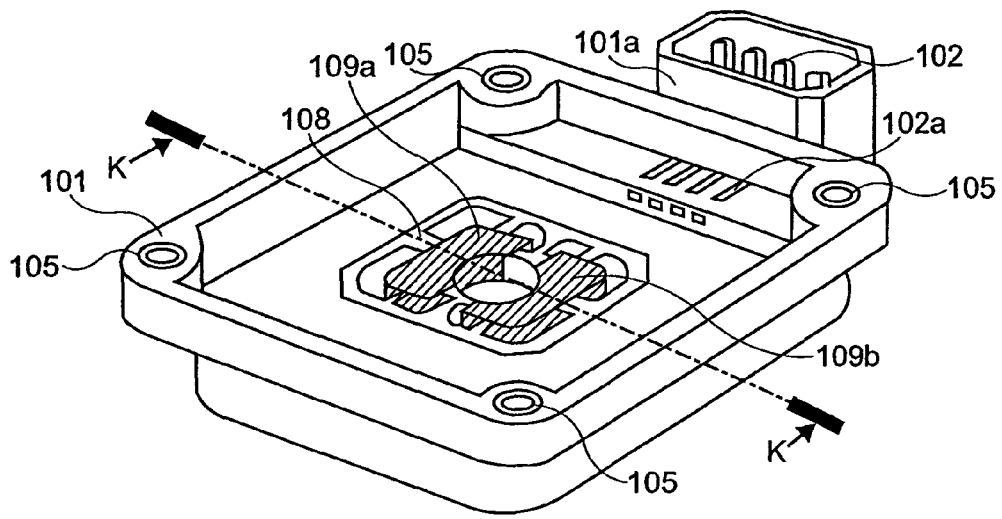
FIG. 26 is a partial cross-section view of the composite molded part according to embodiment 7 of the present invention.
Figure 27:
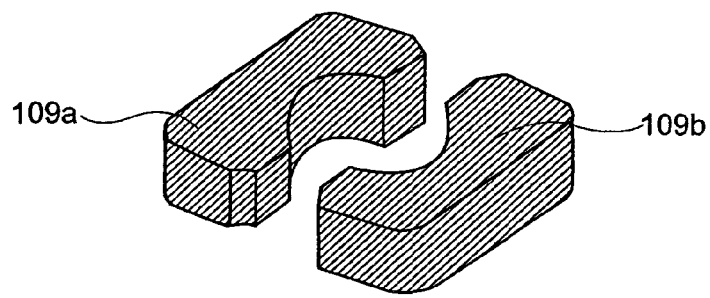
FIG. 27 is an isometric view of the insert of the pre-molded part according to embodiment 7 of the present invention.
Figure 28:
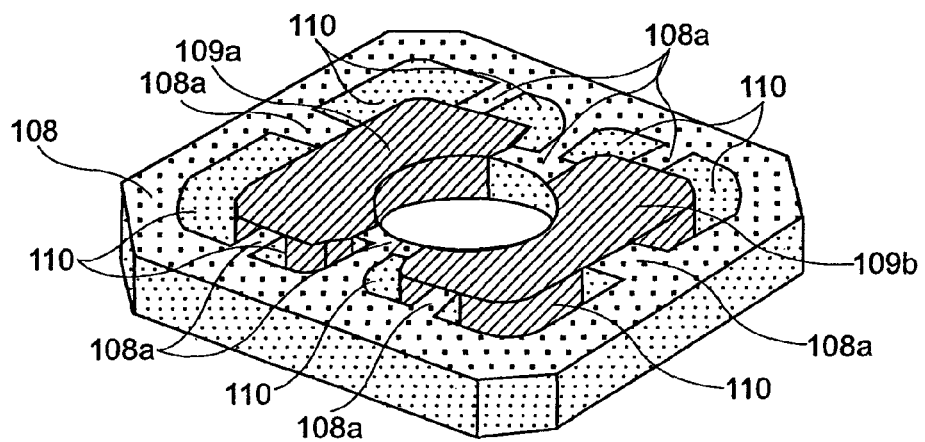
FIG. 28 is an isometric view of the pre-molded part according to embodiment 7 of the present invention.

Though the metallic terminal is used as the insert in embodiments 1 to 6, the insert is not limited to this example but any combination of materials is allowed. In embodiment 7, in order to configure the magnetic circuit by using composite molded parts, the pre-molded part 108 shown in FIG. 28 is obtained by inserting the magnetic parts 109 and 1-9 shown in FIG. 27 as the insert, and the pre-molded part 108 is inserted as the insert as well as the metallic terminals for electrical contact 102 and the bush 105 to be used for mounting at the main body. The composite molded part 101 finished by molding with the over-molded part 101a is shown in FIG. 26. In this embodiment, the magnetic parts 109a and 109b are described specifically in the following explanation.

The pre-molded part 108 is obtained by inserting a couple of magnetic material parts 109a and 109b into a designated position of the die assembly, and by pre-molding those insert members with pre-molded part 108a composed of PBT resin by an injection molding method. In addition, after molding, heat treatment is applied to the pre-molded part 108 in the high temperature reservoir at 150° C. lower than the crystalline melting point of the pre-molded part 108a in about 1 hour. The pre-molded part 108 with heat treatment applied is inserted as the insert, and then, the over-molding processing is applied to the insert with the over-molded part 101a composed of the same material as the pre-molded part 108, and finally the composite molded part 101 can be obtained as the over-molded part.

Figure 29:
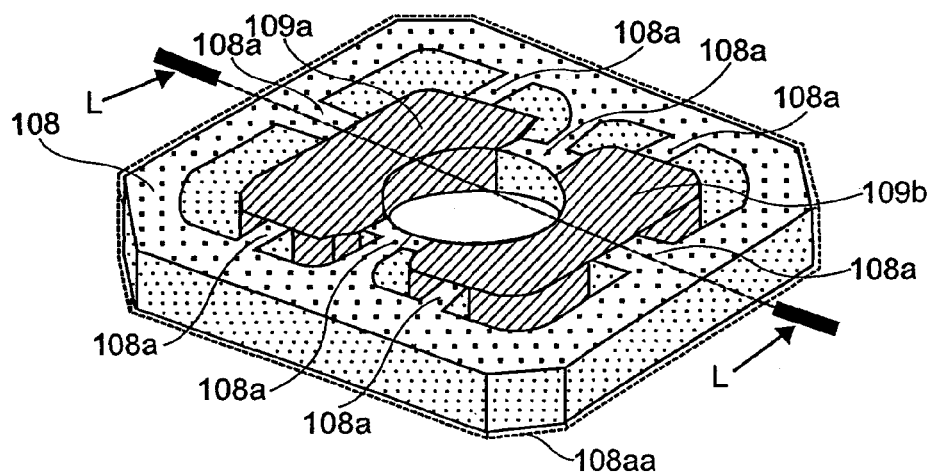
FIG. 29 is an isometric view of the pre-molded part when the resin contraction occurs according to embodiment 7 of the present invention.
Figure 30:
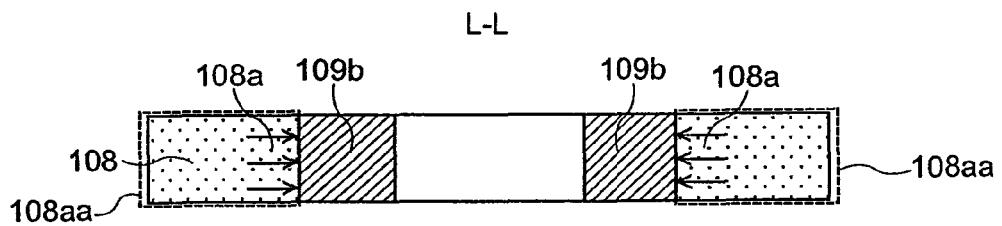
FIG. 30 is a cross-section view along line L-L in FIG. 29 of the pre-molded part when the resin contraction occurs according to embodiment 7 of the present invention.
Figure 31:
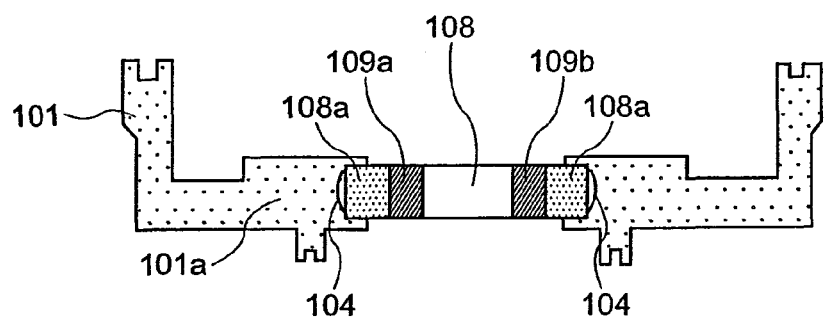
FIG. 31 is a cross-section view of the composite molded part according to embodiment 7 of the present invention.

Owing to this heat treatment, the internal distortion caused during the molding process in the pre-molded part 108a before heat treatment can be released and the crystallization of the pre-molded part 108aa can be accelerated, which leads to the contraction of the pre-molded part 3a in the direction so as to fasten the magnetic material parts 109a and 109b as shown in FIG. 29 and FIG. 30. Therefore, also in the composite molded part 101 formed by over-molding as shown in FIG. 31, even if the gap 104 might be developed between the pre-molded parts 108a and the over-molded part 101a, it will be appreciated that there is no gap generated between the magnetic material parts 109a and 109b and the pre-molded part 108a, which can lead to the establishment of precise support performance of the pre-molded part 108a for the magnetic material parts 109a and 109b. In this configuration of the pre-molded part 108, there are several gaps 110 between the magnetic material parts 109a and 109b and the over-molded part 101a, and this gap 110 contributes to the relaxation of the distortional deviation in the resin volume due to the temperature change.

The above described embodiments can be applied to an apparatus forming a rotating body such as motors, and to sensors for sensing the angles, positions and displacement using the rotating body and for supplying an electric signal, and further are applicable to the actuator and drive apparatus having those sensors. For example, those sensors include throttle valves for adjusting the intake air volume and the throttle position sensors mounted onto the throttle valve, the accelerator pedal position sensor for detecting the accelerator opening, and other sensors for forming those sensors and their control structure in the automobile industry. The above embodiment is not limited to the products mentioned above, but can be applied to those products which can resolve the problems to be solved by the present invention.

When the molded part in the above embodiment is configured as described above, there is no gap generated at the interface between the insert and the resin surrounding the insert and so that firm contact can be established and thus the following effects can be obtained.

As the internal distortion in the pre-molded part due to the heat treatment can be relaxed and the crystallization of the pre-molded part can be accelerated, the dimension of the molded part after heat treatment can be stabilized and the deformation can be reduced, and the quality and productivity in automation can be increased for the insert which requires a high precision positioning process.

As for the wire bonding performance, extremely subject to the gap between the insert and the pre-molded part, both parts can be firmly contacted to each other without gap, and hence stable bonding performance can be established without ultrasonic vibration energy dispersion at the bonding process.

Because the absence of a gap between the insert and the resin part can be established in comparison with the conventional insert members, the application to sensors and on-board circuit parts used in the critical environment in which the conventional parts can not be applied can be established.

As the pre-molded part can be obtained by an insert molding process using injection molding method which provides an advantage in molding efficiency by using the thermo setting resin having crystallinity, higher productivity and lower production cost can be established.

As the pre-molded part can be defined in advance by the mold die assembly, the resin parts having an effective shape in order to increase the contact between the insert and the resin part surrounding the insert can be arranged with a high degree of accuracy, and the pre-molded part can be designed relatively freely without constraint applied to the quality, shape, arrangement and numbers of the inserts put into the die assembly.

According to the present invention, the electronic parts are arranged on the mold or inside the mold, and the molded part for the electronic apparatus can be realized by providing the electric signal exchange with outside.

The above described embodiments can be applied to the apparatus forming the rotating body such as motors, and to the sensors for sensing the angles, positions and displacement using the rotating body and for supplying the electric signal, and further are applicable to the actuator and drive apparatus having those sensors.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

The invention claimed is:

1. A production method of a composite molded part comprising:
   providing a pre-molded member consisting essentially of thermoplastic resin having crystallinity,
   subsequently forming at least one pre-molded part by pre-molding at least one insert member consisting essentially of metal, ceramic, resin, or a combination of those materials with the pre-molded member,
   applying heat treatment to a surrounding pre-molded member of said pre-molded part at a temperature of from 130° C. to 170° C. lower than a crystalline melting point of said pre-molded part of from 220° C. to 270° C. for about one hour, and then applying an insert molding process to an over-molding member to insert said pre-molded part, which has been cooled, solidified, and molded, into the over-molding member, and
   over-molding said at least one pre-molded part with an over-molded member consisting essentially of thermoplastic resin to form the composite molded part.

2. The production method of claim 1, wherein said at least one insert member is at least one metallic terminal to be used for electrical connection.

3. The production method of claim 1, wherein said pre-molded part includes plural insert members, and the pre-molded part is inserted and molded together with said over-molded part.

4. The production method of claim 1, wherein said pre-molded part includes plural insert members, and said at least one pre-molded part is one of plural pre-molded parts that are overlapped, inserted, and molded together with said over-molded member.

5. The production method of claim 1, wherein said pre-molded member and said over-molded member consist essentially of the same filled resin.

6. The production method of claim 5, wherein an amount of filler in said pre-molded part is equal to an amount of filler in said over-molded member.

7. The production method of claim 5, wherein said pre-molded member consists essentially of a resin with a filler fraction higher than that of said over-molded member.

8. The production method of composite molding part according to claim 1, wherein both said pre-molded member and said over-molded member consist essentially of a resin filled with filler, and said pre-molded member consists essentially of a resin with a crystalline melting point higher than that of said over-molded member.

9. The production method of composite molding part according to claim 1, wherein said pre-molded member and said over-molded member consist essentially of a filled resin, and said pre-molded member consists essentially of a resin with a crystalline melting point lower than that of said over-molded member.

10. An electronic part formed by the production method according to claim 1, wherein a gap that remains at an interface between said at least one insert member and said pre-molded member after applying said heat treatment is narrower than a gap generated at an interface between said pre-molded part and said over-molded member after forming the composite molded part.

* * * * *